(12) United States Patent
Oh et al.

(10) Patent No.: US 11,027,191 B2
(45) Date of Patent: Jun. 8, 2021

(54) AUXILIARY CONTROL ELECTRONIC DEVICE OF MOBILE TERMINAL

(71) Applicant: Samsung Electronics Co., Ltd., Gyeonggi-do (KR)

(72) Inventors: Junhwa Oh, Gyeonggi-do (KR); Woochul Lee, Gyeonggi-do (KR); Byunghun Cho, Gyeonggi-do (KR); Jaewoong Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/562,550

(22) Filed: Sep. 6, 2019

(65) Prior Publication Data

US 2020/0078670 A1    Mar. 12, 2020

(30) Foreign Application Priority Data

Sep. 7, 2018  (KR) ......................... 10-2018-0107096

(51) Int. Cl.
*A63F 13/24* (2014.01)
*H05K 7/20* (2006.01)
*H04B 1/3827* (2015.01)

(52) U.S. Cl.
CPC ......... *A63F 13/24* (2014.09); *H05K 7/20154* (2013.01); *H05K 7/20172* (2013.01); *H04B 1/3827* (2013.01)

(58) Field of Classification Search
CPC ........... A63F 13/24; A63F 13/92; A63F 13/98
See application file for complete search history.

(56) References Cited

U.S. PATENT DOCUMENTS

| | | | | |
|---|---|---|---|---|
| 9,687,735 | B2 * | 6/2017 | Hong | A63F 13/24 |
| 10,272,325 | B1 * | 4/2019 | Nevarez | A63F 13/2145 |
| 10,632,368 | B2 * | 4/2020 | Fujita | A63F 13/24 |
| 2005/0078086 | A1 * | 4/2005 | Grams | A63F 13/211 345/158 |
| 2006/0252537 | A1 * | 11/2006 | Wu | A63F 13/02 463/36 |
| 2007/0021210 | A1 * | 1/2007 | Tachibana | A63F 13/211 463/37 |
| 2011/0118032 | A1 | 5/2011 | Zalewski | |
| 2012/0300376 | A1 * | 11/2012 | Chang | A63F 13/98 361/679.01 |
| 2013/0095925 | A1 | 4/2013 | Xu | |

(Continued)

FOREIGN PATENT DOCUMENTS

JP    2005-321287 A    11/2005
KR    10-0430081 B1    5/2004

(Continued)

OTHER PUBLICATIONS

International Search Report dated Dec. 20, 2019.

*Primary Examiner* — Jay Trent Liddle
(74) *Attorney, Agent, or Firm* — Cha & Reiter, LLC.

(57) ABSTRACT

Provided is an auxiliary electronic controller of a mobile terminal includes a main body having a seating portion configured to seat the mobile terminal at a top surface of the main body, and having a radiating structure disposed therein, a first holding portion formed at one side of the main body, and a second holding portion hinge-coupled to another side facing the one side of the main body to rotate to a bottom surface of the main body.

20 Claims, 17 Drawing Sheets

(56) References Cited

U.S. PATENT DOCUMENTS

| | | | | |
|---|---|---|---|---|
| 2013/0106687 A1* | 5/2013 | Baum | ............... | A63F 13/73 345/156 |
| 2013/0109476 A1* | 5/2013 | Baum | ............... | A63F 13/235 463/37 |
| 2013/0154943 A1* | 6/2013 | Joynes | ............... | G06F 1/1632 345/169 |
| 2013/0157763 A1* | 6/2013 | Joynes | ............... | A63F 13/08 463/32 |
| 2013/0157764 A1* | 6/2013 | Joynes | ............... | A63F 13/92 463/37 |
| 2013/0159928 A1* | 6/2013 | Joynes | ............... | A63F 13/533 715/810 |
| 2013/0178285 A1* | 7/2013 | Joynes | ............... | A63F 13/24 463/31 |
| 2013/0178290 A1* | 7/2013 | Joynes | ............... | A63F 13/02 463/37 |
| 2013/0184077 A1* | 7/2013 | Galpern | ............... | A63F 13/06 463/37 |
| 2013/0267322 A1* | 10/2013 | South | ............... | A63F 13/92 463/38 |
| 2013/0341214 A1* | 12/2013 | King | ............... | A63F 13/98 206/216 |
| 2014/0179437 A1* | 6/2014 | King | ............... | A63F 13/24 463/37 |
| 2014/0274394 A1* | 9/2014 | Willis | ............... | G06F 3/0338 463/37 |
| 2014/0364231 A1* | 12/2014 | Cramer | ............... | A63F 13/06 463/37 |
| 2014/0364232 A1* | 12/2014 | Cramer | ............... | A63F 13/98 463/37 |
| 2014/0370982 A1* | 12/2014 | Liu | ............... | A63F 13/2145 463/31 |
| 2015/0018101 A1 | 1/2015 | Schoenith et al. | | |
| 2015/0031452 A1 | 1/2015 | Rundell et al. | | |
| 2015/0174482 A1* | 6/2015 | Hirshberg | ............... | A63F 13/98 463/37 |
| 2015/0205328 A1* | 7/2015 | Lin | ............... | A63F 13/98 361/679.44 |
| 2015/0273325 A1* | 10/2015 | Falc | ............... | A63F 13/98 463/37 |
| 2016/0051900 A1* | 2/2016 | Townley | ............... | G06F 3/0219 463/31 |
| 2016/0051901 A1* | 2/2016 | Townley | ............... | A63F 13/23 463/31 |
| 2016/0051902 A1* | 2/2016 | Joynes | ............... | A63F 13/235 463/31 |
| 2016/0107082 A1* | 4/2016 | Song | ............... | A63F 13/24 463/37 |
| 2017/0056762 A1 | 3/2017 | Gafni | | |
| 2017/0153672 A1 | 6/2017 | Shin et al. | | |
| 2017/0182409 A1* | 6/2017 | Townley | ............... | A63F 13/06 |
| 2017/0315586 A1* | 11/2017 | Townley | ............... | G06F 3/0219 |
| 2017/0315626 A1* | 11/2017 | Townley | ............... | A63F 13/98 |
| 2017/0319953 A1* | 11/2017 | Townley | ............... | A63F 13/98 |
| 2017/0326447 A1* | 11/2017 | Townley | ............... | A63F 13/98 |
| 2018/0036635 A1* | 2/2018 | Townley | ............... | G06F 13/4022 |

FOREIGN PATENT DOCUMENTS

| | | |
|---|---|---|
| KR | 10-2005-0033187 A | 4/2005 |
| KR | 20-0410988 Y1 | 3/2006 |
| KR | 10-2011-0116892 A | 10/2011 |
| KR | 10-2012-0007334 A | 1/2012 |
| KR | 10-2017-0009968 A | 1/2017 |
| KR | 10-2017-0062876 A | 6/2017 |

\* cited by examiner

AUXILIARY CONTROL ELECTRONIC DEVICE OF MOBILE TERMINAL

CROSS-REFERENCE TO RELATED APPLICATION(S)

This application is based on and claims priority under 35 U.S.C. § 119 to Korean Patent Application No. 10-2018-0107096, filed on Sep. 7, 2018, in the Korean Intellectual Property Office, the disclosure of which is incorporated by reference herein in its entirety.

BACKGROUND

1. Field

The disclosure relates to an auxiliary control device capable of supporting a mobile terminal while enabling the mobile terminal to be manipulated more freely and conveniently.

2. Description of the Related Art

Mobile terminals may perform various functions in a complex manner, thereby producing a high performance in order to realize an advanced performance. As an input means of the mobile terminal, a touch screen may be mainly used.

With a touch screen, which is a primary input means of the mobile terminal, it may be difficult or inconvenient to perform an elaborate manipulation when using a particular application.

The above information is presented as background information only to assist with an understanding of the present disclosure. No determination has been made, and no assertion is made, as to whether any of the above might be applicable as prior art with regard to the present disclosure.

SUMMARY

In accordance with an aspect of the disclosure, an auxiliary electronic controller of a mobile terminal includes a main body having a seating portion configured to seat the mobile terminal at a top surface of the main body, and having a radiating structure disposed therein; a first holding portion formed at one side of the main body; and a second holding portion hinge-coupled to another side facing the one side of the main body to rotate to a bottom surface of the main body.

In accordance with another aspect of the disclosure, an auxiliary electronic controller of a mobile terminal includes a main body having a seating portion configured to seat the mobile terminal at a top surface; a first holding portion formed at one side of the main body; and a second holding portion hinge-coupled to another side facing one side of the main body to rotate to a bottom surface of the main body, wherein the second holding portion rotates to the bottom surface of the main body and then the mobile terminal is seated in the seating portion.

Other aspects, advantages, and salient features of the disclosure will become apparent to those skilled in the art from the following detailed description, which, taken in conjunction with the annexed drawings, discloses certain embodiments of the disclosure.

BRIEF DESCRIPTION OF THE DRAWINGS

The objects, features, and advantages of the disclosure will be more apparent from the following detailed description in conjunction with the accompanying drawings, in which.

DETAILED DESCRIPTION

Figure 1:
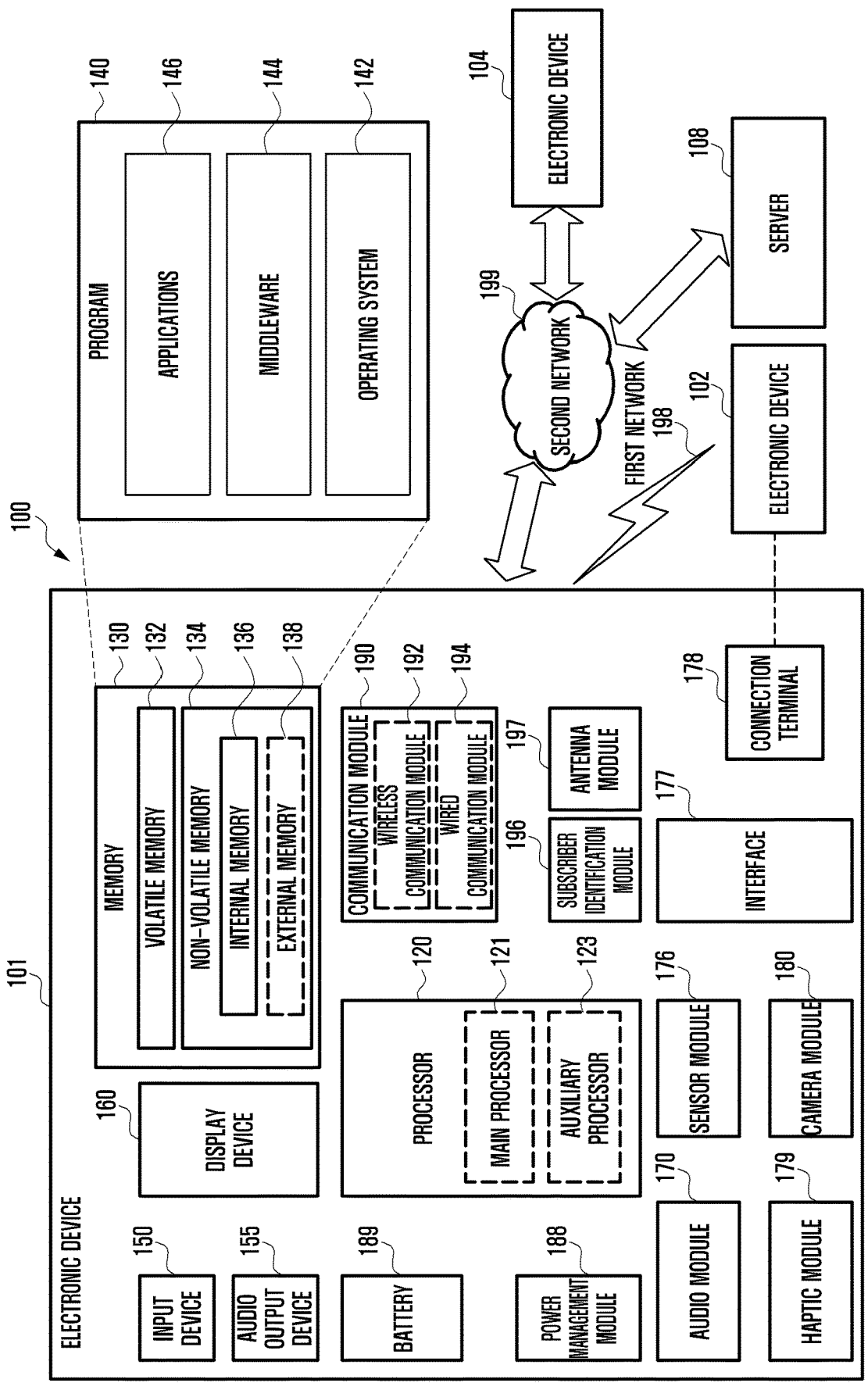
FIG. 1 is a block diagram illustrating an electronic device in a network environment according to certain embodiments of the disclosure.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199

(e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, hardware programmed by software, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

While the electronic device 101 of FIG. 1 can be controlled by a touch screen, it would be advantageous to diversify the ways that the electronic device 101 can be controlled. For example, an auxiliary electronic controller can be used to control the mobile terminal.

Figure 2A:
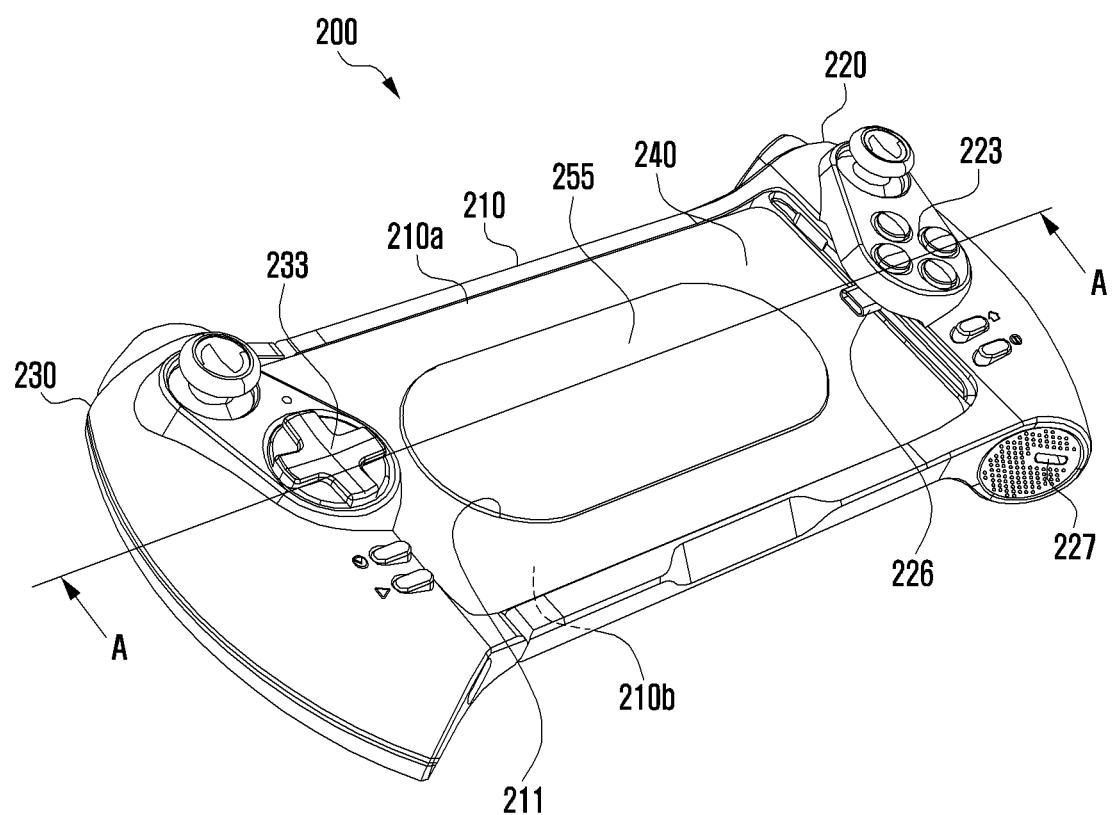
FIG. 2A and FIG. 2B are front perspective views illustrating an auxiliary control electronic device according to an embodiment of the disclosure.
Figure 2B:
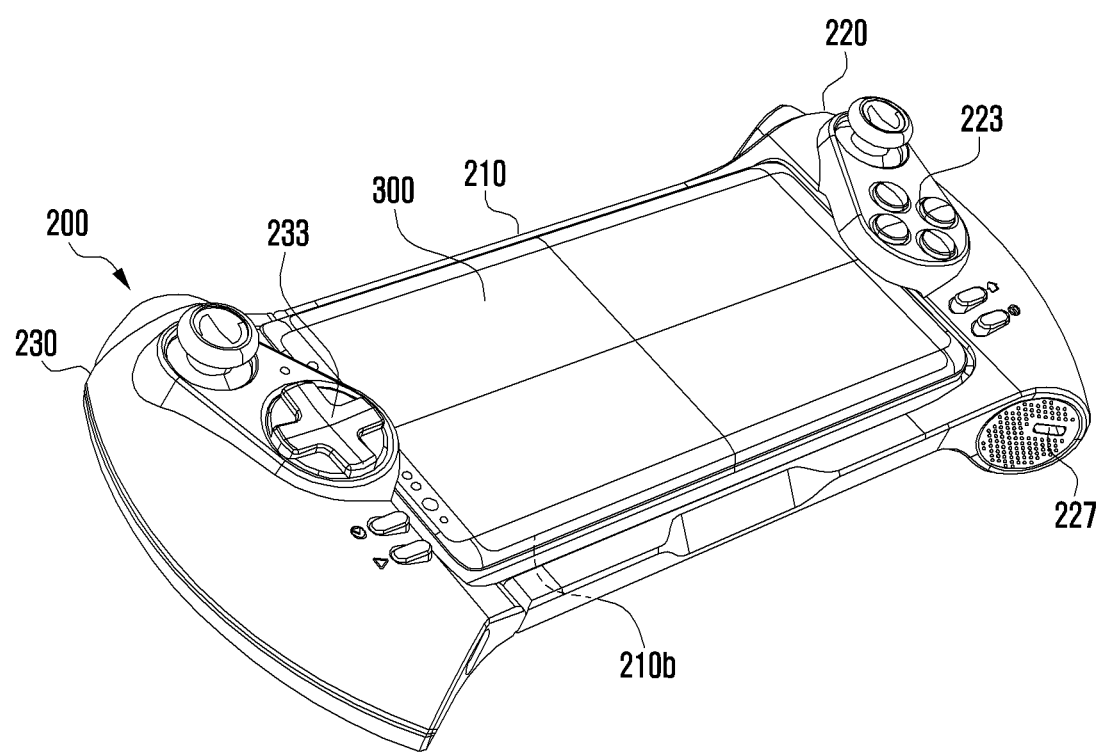

FIG. 2A is a perspective view illustrating a top surface 210a of an auxiliary control electronic device 200 (alternatively referred to as an "auxiliary electronic controller") according to an embodiment of the disclosure, and FIG. 2B is a diagram illustrating a state in which a mobile terminal 300 is seated in the auxiliary control electronic device 200 of FIG. 2A.

The auxiliary control electronic device 200 according to an embodiment of the disclosure may include a main body 210, first holding portion 220, and second holding portion 230.

When describing the auxiliary control electronic device 200 according to an embodiment of the disclosure, the top surface 210a may mean a surface in which the mobile terminal 300 is seated based on the main body 210, and the bottom surface 210b may mean a surface opposite to the top surface 210a. A top surface of the first holding portion 220 and the second holding portion 230 may mean a surface positioned in the same direction as that of the top surface based on the main body 210, and a bottom surface thereof may mean a surface opposite to the top surface. When describing the main body 210, the first holding portion 220, and the second holding portion 230, a direction of the top surface and the bottom surface is not absolute; and, when a direction of any one surface is changed, a direction of the other surface may be also changed corresponding thereto.

Figure 5A:
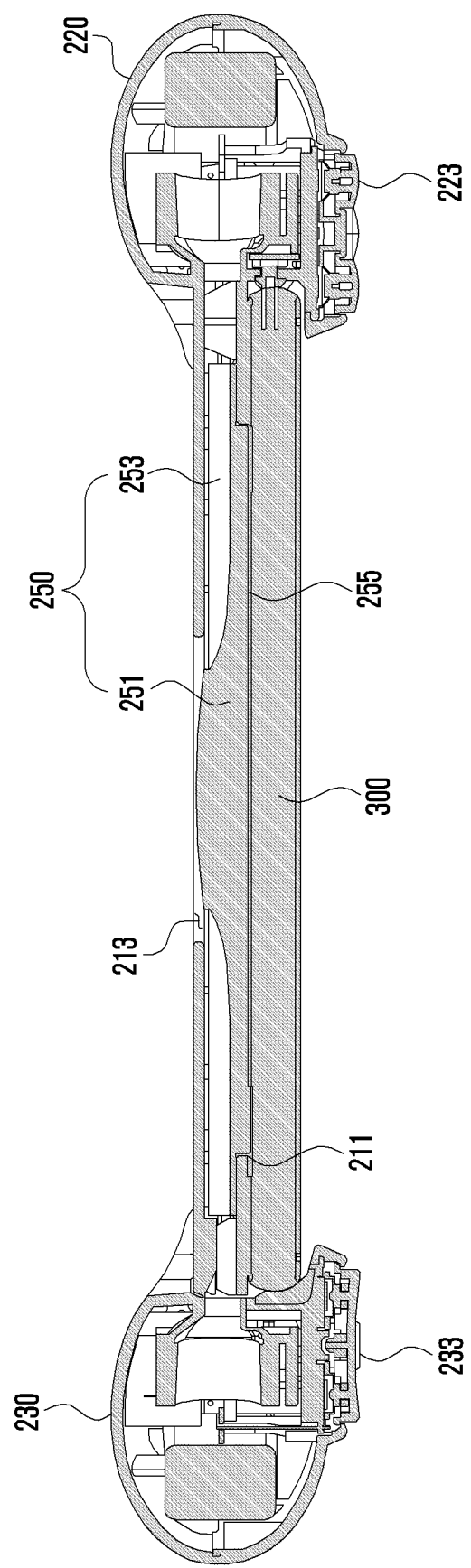
FIG. 5A, FIG. 5B, and FIG. 5C are diagrams illustrating a radiating structure of an auxiliary control electronic device according to an embodiment of the disclosure.
Figure 5B:
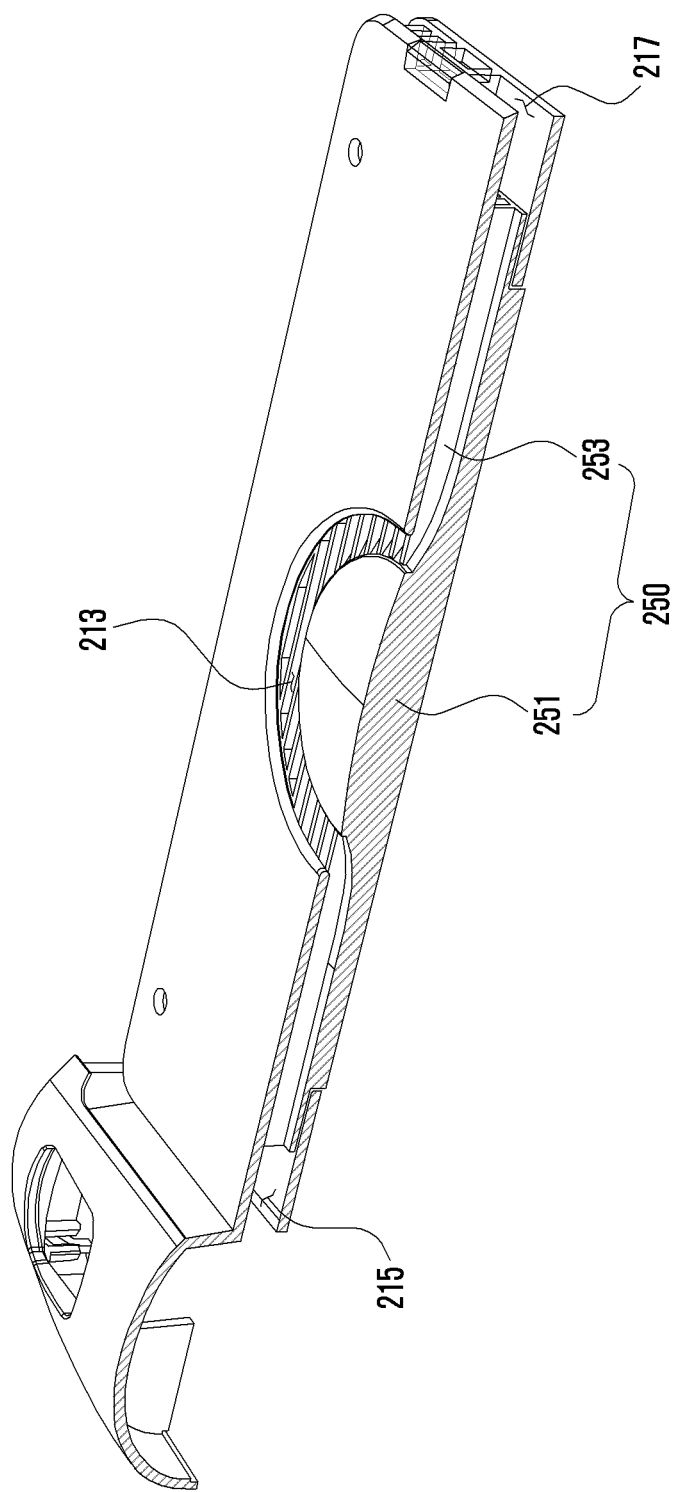

The main body 210 according to an embodiment of the disclosure may include a seating portion 240 and a radiating structure formed under the seating portion 240 (not shown in FIGS. 2A, 2B because of obscuring by the 240, but shown in FIG. 5B, 250). The radiating structure under the seating portion be used to radiate heat from a mobile terminal seated in the seating portion 240.

The seating portion 240 according to the embodiment of the disclosure is a space in which the mobile terminal 300 may be seated and may be formed at the top surface of the main body 210. The seating portion 240 may be formed to correspond to a size of the mobile terminal 300. When wanting to seat the mobile terminal 300 having a size smaller than that of the seating portion 240, the mobile terminal 300 may be seated in the seating portion 240 using a separate adapter (not illustrated).

The separate adapter can be a ring-like structure in a shape and size corresponding to the seating portion 240 and having an opening corresponding to the mobile terminal 300 having a smaller size.

In the main body 210 according to an embodiment of the disclosure, an internal space may be formed under the seating portion 240. In the internal space of the main body 210, a radiating structure may be formed to dissipate heat formed by the mobile terminal 300. At a top surface of the main body 210, a front opening 211 may be formed to connect an outer space of the top surface 210a side of the main body 210 and an internal space of the main body 210. At the internal space of the main body 210, a radiating structure may be disposed under the seating portion 240, and one surface of a heat sink (obscured by the seating portion 240, but see FIG. 5B, 251) disposed under the seating portion 240 may contact the mobile terminal 300 seated in the seating portion 240 through the front opening 211. At one surface of the heat sink, a thermal conductive sheet 255 may be attached to correspond to the size of the front opening 211, and the thermal conductive sheet 255 may contact the mobile terminal 300. In certain embodiments, the heat sink 251 may be disposed directly under the conductive sheet 255.

The first holding portion 220 according to an embodiment of the disclosure may be formed at one side corner of the main body 210 and may include a first control panel 223 (which, in certain embodiments, can comprise physical direction keys and a joystick), first communication interface 226, and second communication interface 227.

The first holding portion 220 according to an embodiment of the disclosure is a portion which is formed to accommodate a user grip or hold when using the auxiliary control electronic device 200 and may have a thickness larger than that of the main body 210. The first holding portion 220 may have an internal space therein, and a first ventilation fan to be described later (see FIG. 4C, 222), a battery (not illustrated), and an eccentric motor (not illustrated) may be disposed in the internal space.

The first control panel 223 according to an embodiment of the disclosure may be positioned at the center of one side corner of the main body 210 and be formed at a top surface of the first holding portion 220. A position of the first control panel 223 may correspond to a position in which a user's thumb is easily positioned in a state in which the user holds the first holding portion 220. The first control panel 223 may maintain a predetermined distance from the top surface of the main body 210 in the first holding portion 220 and protrude in a direction of the main body 210. A vertical distance between the protruding portion of the first control panel 223 and a top surface of the main body 210 may correspond to a thickness of the mobile terminal 300. As part of the mobile terminal 300 is inserted between the protruding portion of the first control panel 223 and the main body 210, a coupling state of the mobile terminal 300 and the auxiliary control electronic device 200 may be more secure.

The first communication interface 226 according to an embodiment of the disclosure may be formed in a wall surface of a connected portion of the first holding portion 220 and the main body 210; and, more specifically, the first communication interface 226 may be formed in a space between the first control panel 223 and the top surface of the main body 210. The first communication interface 226 may be, for example, a universal serial bus (USB) terminal. The first communication interface 226 may be coupled to the mobile terminal 300 in a process in which the mobile terminal 300 is inserted into a space between the protruding portion of the first control panel 223 and the top surface of the main body 210. The mobile terminal 300 may be connected to the first communication interface 226 to communicate with the auxiliary control electronic device 200, thereby transferring control signals of the first control panel 223 and a second control panel 233 and a fourth control panel 234 to be described later to the mobile terminal 300. In certain embodiments, the second control panel 224 and the fourth control panel 234 can comprise a trigger key.

The first communication interface 226 according to an embodiment of the disclosure may use a wireless communication method such as Bluetooth or Wi-Fi. Because the mobile terminal 300 mounted in the auxiliary control electronic device 200 is small, when an adapter is used, it may be difficult for the mobile terminal 300 to be connected to the USB terminal, and when the USB terminal is in an unavailable state, the mobile terminal 300 and the auxiliary control electronic device 200 may be connected with a wireless communication method.

A battery (not illustrated) according to an embodiment of the disclosure may be disposed in the first holding portion 220 or the second holding portion 230 or at both the first holding portion 220 and the second holding portion 230, and provide power to the mobile terminal 300 through the first communication interface 226. Further, the battery may supply power to a first ventilation fan 222 disposed in the first holding portion 220 and/or a second ventilation fan (obscured by 230, but see FIG. 4A, 232) to be described later.

The second communication interface 227 according to an embodiment of the disclosure may be formed in the first holding portion 220 and be connected to the first communication interface 226 and the battery. The second communication interface 227 may be, for example, a port for inserting a USB terminal and receive power from the outside to charge the battery, and perform a data communication port function for connecting the mobile terminal 300 to another external device.

The second communication interface 227 may be positioned at the lower end of the first holding portion 220 to be disposed at a position that would not generally be covered by a user's hand when holding the first holding portion 220. This can include the side of the lower end of the first holding portion 220.

The second holding portion 230 according to an embodiment of the disclosure may be formed at the other side corner of the main body 210 and include a second control panel 233.

The second holding portion 230 according to an embodiment of the disclosure is shaped to accommodate a user grip when using the auxiliary control electronic device 200, and may be formed of a thickness larger than that of the main body 210. The second holding portion 230 may have an internal space therein and a second ventilation fan 232 to be described later, a battery (not illustrated), and an eccentric motor (not illustrated) may be disposed in the internal space.

The second holding portion 230 according to an embodiment of the disclosure is formed at the other side corner of the main body 210, but it may be hinge-coupled to the main body 210 to rotate within a predetermined range. For example, the second holding portion 230 may be bent and rotate in a rear direction of the main body 210 in a state coupled to the main body 210, as in the first holding portion 220. When a state in which the second holding portion 230 is coupled to the main body 210, as in the first holding portion 220, it is referred to as a fixed state; and a state in which the second holding portion 230 is bent and rotates in a rear direction of the main body 210 may be referred to as an opening state. A range in which the second holding portion 230 rotates in the opening state may be a range that avoids interference with a mobile terminal 300 seated in the seating portion 240 of the main body 210 by a rotation of the second holding portion 230. The second holding portion 230 can be shaped such that when rotated about the hinge, no portion of the second holding portion 230 collides with the space occupied by the mobile terminal 300.

The second control panel 233 according to an embodiment of the disclosure may be positioned at the center of the other side corner of the main body 210 and be formed at a top surface of the second holding portion 230. A position of the second control panel 233 may correspond to a position proximate to the location of a user's thumb, when the user holds the second holding portion 230. The second control panel 233 may maintain a predetermined distance from the top surface of the main body 210 in the second holding portion 230 based on a fixed state of the second holding portion 230 and be protruded in a direction of the main body 210. A distance between the second holding portion 230 and the top surface of the main body 210 may correspond to a thickness of the mobile terminal 300. After the mobile terminal 300 is seated in the seating portion 240, by rotating the second holding portion 230 in a front direction of the main body 210, the second holding portion 230 may be changed to a fixed state; and, as the mobile terminal 300 is inserted between the second control panel 233 of the second holding portion 230 and the main body 210, a coupling state of the mobile terminal 300 and the auxiliary control electronic device 200 may be more secured.

Figure 3A:
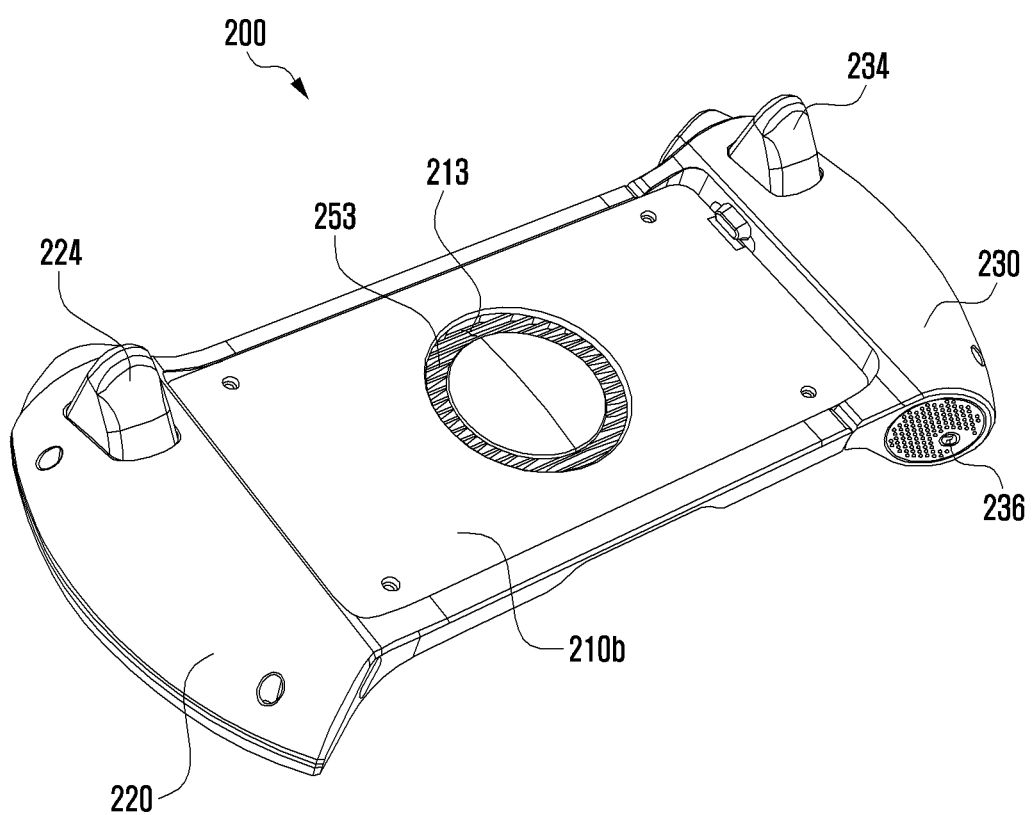
FIG. 3A and FIG. 3B are rear perspective views illustrating an auxiliary control electronic device according to an embodiment of the disclosure.
Figure 3B:
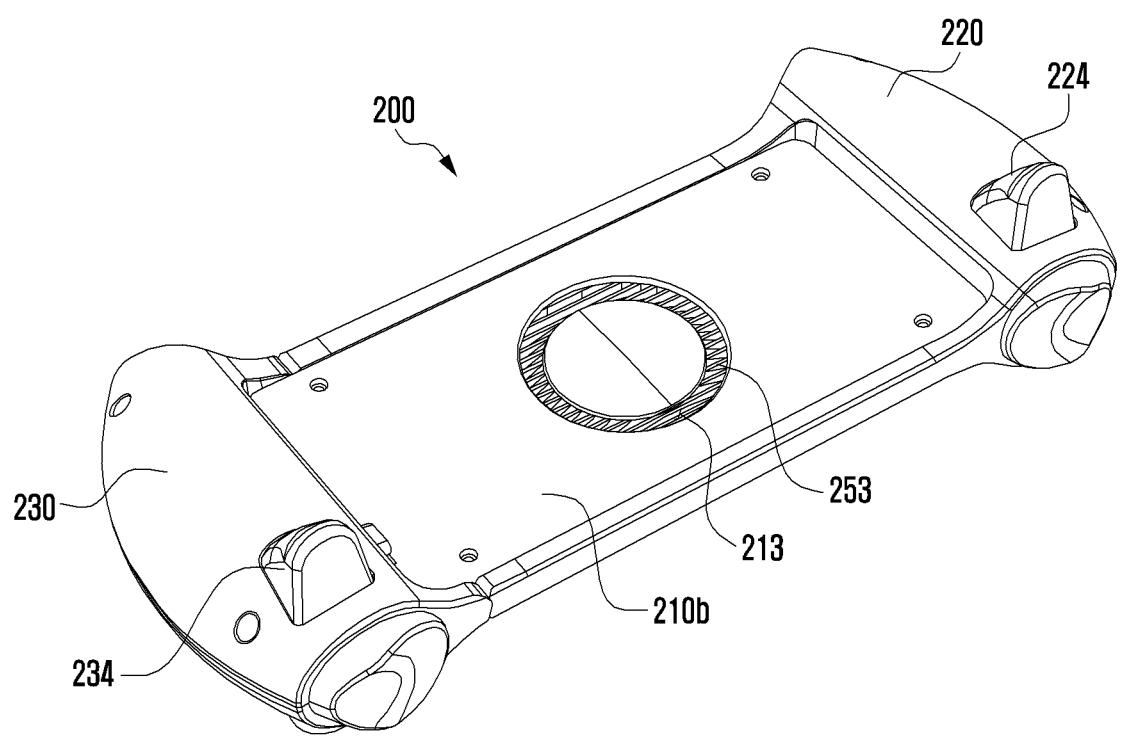

FIG. 3A is a diagram illustrating a lower portion of a bottom surface of the auxiliary control electronic device 200 according to an embodiment of the disclosure, and FIG. 3B is a diagram illustrating an upper portion of a bottom surface of the auxiliary control electronic device 200 according to an embodiment of the disclosure.

At a bottom surface of the main body 210 according to an embodiment of the disclosure, a rear opening 213 may be formed. The rear opening 213 may connect an internal space of the main body 210 to the outside of the main body 210. Air supplied by the first ventilation fan disposed inside the first holding portion 220 or the second ventilation fan 232 disposed inside the second holding portion 230 may flow along radiation fins 253 of the radiating structure under the seating portion 240 and be discharged to the rear opening 213.

At a bottom surface of the first holding portion 220 according to an embodiment of the disclosure, a third control panel 224 may be formed. The third control panel 224 may be disposed to protrude from the bottom surface of the first holding portion 220 in a state close to the upper end of the bottom surface of the first holding portion 220. The protruded third control panel 224 may elastically rotate using one side corner as a rotation axis, like a trigger. When an external force operates, the third control panel 224 may be inserted into the first holding portion 220; and, when the external force is removed, the third control panel 224 may be protruded to the bottom surface of the first holding portion 220. The third control panel 224 may be inserted into the first holding portion 220 only when an external force operates that is larger than the sum of a load of the auxiliary control electronic device 200 and a load of the mobile terminal 300 mounted in the auxiliary control electronic device 200. Accordingly, the auxiliary control electronic device 200 may be used as a cradle.

Alternatively, by adjusting a protruding angle of the third control panel 224, the auxiliary control electronic device 200 may be used as a cradle. For example, the auxiliary control electronic device 200 may be used as a cradle by adjusting a point at which the third control panel 224 contacts a bottom surface in order to support the auxiliary control electronic device 200 and a protruding angle of the third control panel 224 so that a position of a rotation axis of the third control panel 224 is perpendicular to the bottom surface.

At a bottom surface of the second holding portion 230 according to an embodiment of the disclosure, a fourth control panel 234 may be formed. The fourth control panel 234 may be disposed to protrude from the bottom surface of the second holding portion 230 in a state close to the upper end of the bottom surface of the second holding portion 230. The protruded fourth control panel 234 may rotate elastically using one side corner as the rotation axis. When an external force operates, the fourth control panel 234 may be inserted into the second holding portion 230; and, when an external force is removed, the fourth control panel 234 may be protruded to the bottom surface of the second holding portion 230. The fourth control panel 234 may be inserted into the second holding portion 230 only when an external force operates that is larger than the sum of a load of the auxiliary control electronic device 200 and a load of the mobile terminal 300 mounted in the auxiliary control electronic device 200.

By adjusting a protruding angle of the fourth control panel 234, the auxiliary control electronic device 200 may be used as a cradle. For example, the auxiliary control electronic device 200 may be used as a cradle by adjusting a point at which the fourth control panel 234 contacts a bottom surface in order to support the auxiliary control electronic device 200 and a protruding angle of the fourth control panel 234 so that a position of a rotation axis of the fourth control panel 234 is perpendicular to the bottom surface.

In the second holding portion 230 according to an embodiment of the disclosure, a third communication interface 236 may be formed. The third communication interface 236 may be a port for inserting, for example, an earphone plug for voice communication (microphone and/or speaker). The third communication interface 236 may be positioned at the low end of the second holding portion 230 to be disposed so as not to be covered by the hands of the user when holding the second holding portion 230. However, a position of the third communication interface 236 is not limited to the low end of the second holding portion 230 and may be positioned at any position so as not to be covered by the user's hands when the user holds the second holding portion 230.

A position of the first communications interface 226 to the third communication interface 236 according to an embodiment of the disclosure may be elsewhere in the first holding portion 220 or the second holding portion 230.

Figure 4A:
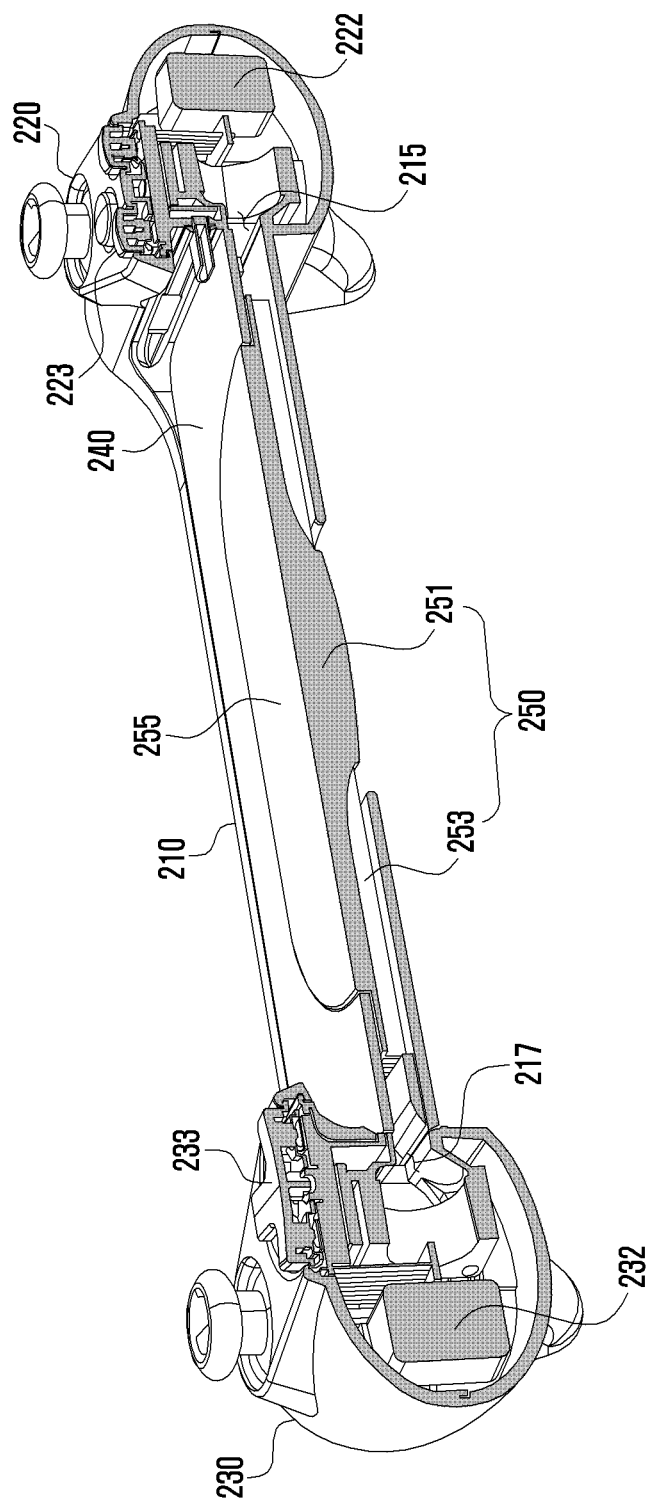
FIG. 4A, FIG. 4B, and FIG. 4C are diagrams illustrating a process of inserting a mobile terminal into an auxiliary control electronic device taken along line A-A of FIG. 2A.
Figure 4B:
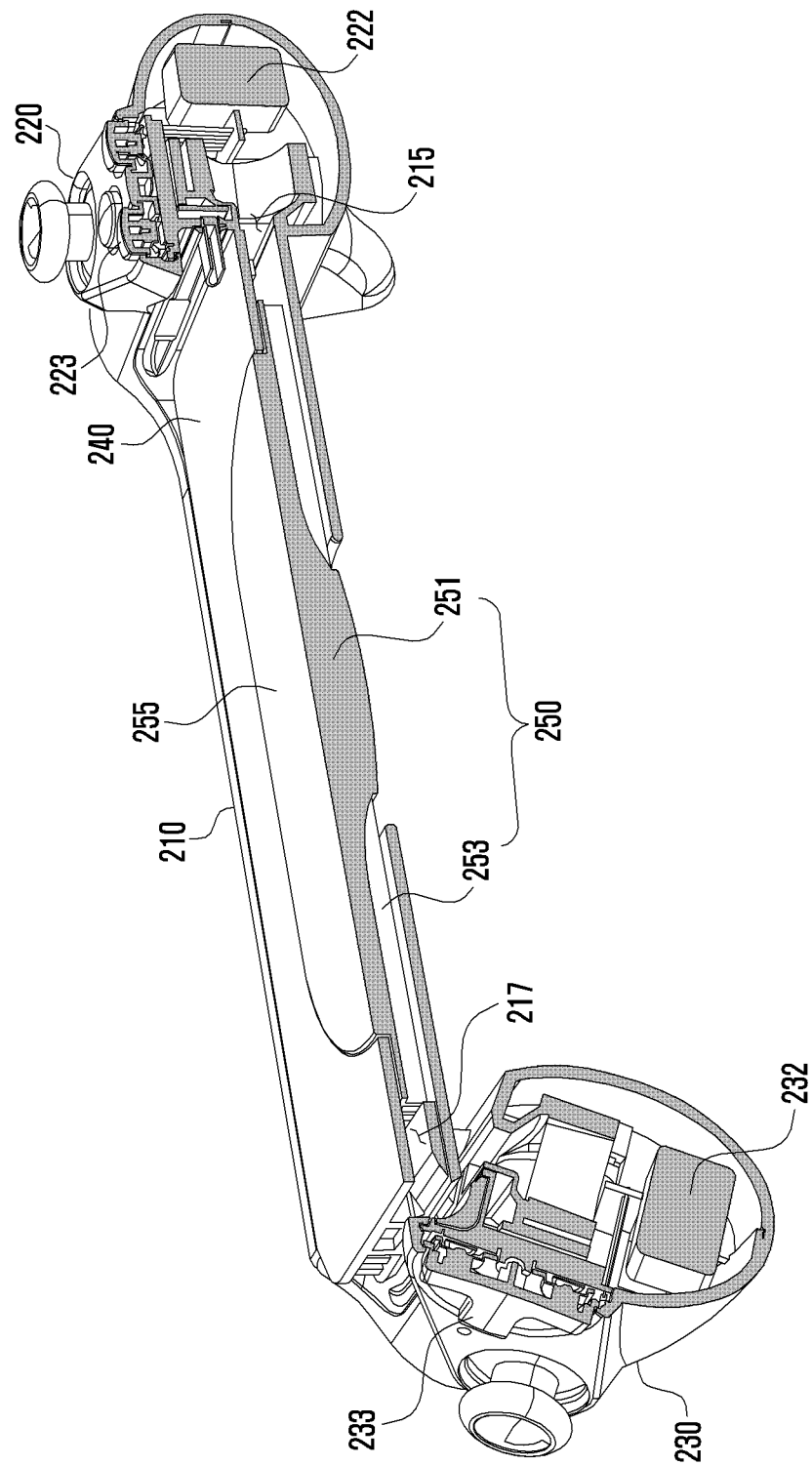
Figure 4C:
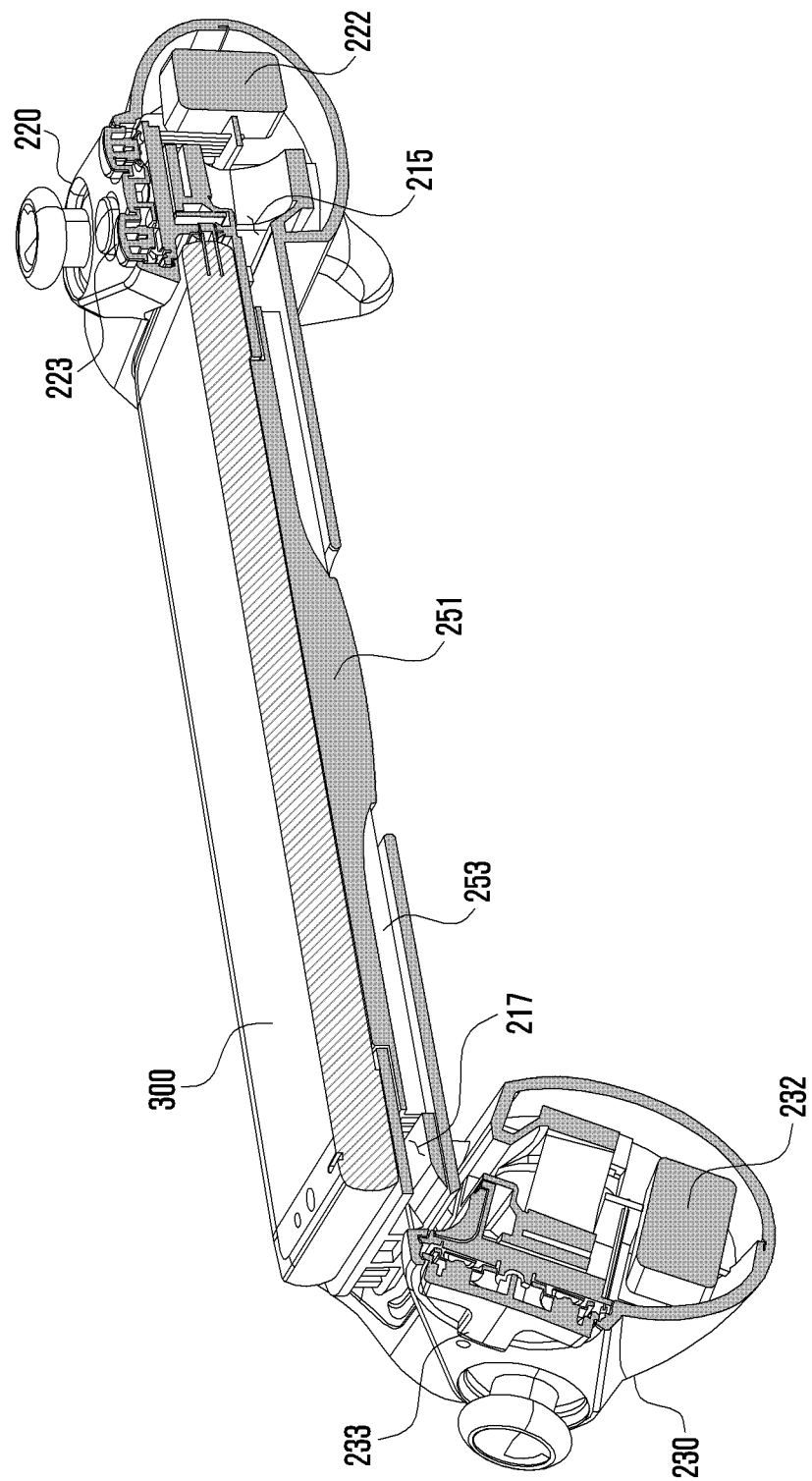

FIGS. 4A to 4C are diagrams illustrating a process of inserting a mobile terminal 300 into an auxiliary control electronic device 200 taken along line A-A of FIG. 2A.

FIG. 4A is a diagram illustrating the second holding portion 230 in a fixed state, FIG. 4B is a diagram illustrating the second holding portion 230 in an opening state, and FIG. 4C is a diagram illustrating the mobile terminal 300 seated in the seating portion 240.

With reference to FIGS. 4A to 4C, in the main body 210 according to an embodiment of the disclosure, a first vent 215 and/or a second vent 217 may be formed. The first vent 215 may connect an internal space of the first holding portion 230 and an internal space of the main body 210, and the second vent 217 may connect an internal space of the second holding portion 230 and an internal space of the main body 210.

In the internal space of the main body 210 according to an embodiment of the disclosure, a radiating structure 250 may be disposed. The radiating structure 250 may include a heat sink 251 and radiation fins 253.

One surface of the heat sink 251 according to an embodiment of the disclosure may contact the mobile terminal 300 through the front opening 211 of the main body 210. A heat generated in the mobile terminal 300 may be transferred to the heat sink 251 to be diffused into the radiating fins 253 and be cooled by air supplied by the first ventilation fan 222 and the second ventilation fan 232. A heat conductive sheet 255 may be attached to one surface of the heat sink 251, which may increase heat transfer efficiency from the mobile terminal 300 to the heat sink 251.

The radiating fins 253 may be disposed at the other surface of the heat sink 251 according to an embodiment of the disclosure and be disposed side by side in a direction of the air-flow created by the first vent 215 and the second vent 217. For example, the radiating fins 253 may be disposed side by side in a lateral direction based on a state illustrated in FIG. 4A. The center of the heat sink 251 may be formed to protrude further than an end portion positioned toward the first holding portion 220 and the second holding portion 230 of the heat sink 251. The protruding portion may correspond to a position of the rear opening 213 of the main body 210. The protruding portion may guide to discharge wind supplied from the first vent 215 and the second vent 217 to the rear opening 213 via the radiation fins 253.

With reference to FIGS. 4A to 4C, the protruding portion of the first control panel 223 may maintain a predetermined vertical distance from the top surface of the main body 210 in the first holding portion 220 and protrude in a direction of the main body 210. The vertical distance between the first control panel 223 and the top surface of the main body 210 may correspond to a thickness of the mobile terminal 300. The second control panel 233 may maintain a predetermined distance from the top surface of the main body 210 in the second holding portion 230 and may protrude in a direction of the main body 210. A vertical distance between a protruding portion of the second control panel 233 and the top surface of the main body 210 may correspond to a thickness of the mobile terminal 300. As the mobile terminal 300 is inserted between the first control panel 223 and the main body 210 and the second control panel 233 and the main body, a coupling state of the mobile terminal 300 and the auxiliary control electronic device 200 may be firmly maintained.

The first holding portion 220 according to an embodiment of the disclosure may have an internal space therein and include at least one of a first ventilation fan 222, an eccentric motor or a battery.

The first ventilation fan 222 according to an embodiment of the disclosure may blow air to an internal space of the main body 210 through the first vent 215. The supplied air may flow along the radiation fins 253 and be discharged through the rear opening 213.

The eccentric motor according to an embodiment of the disclosure may operate according to a manipulation of the mobile terminal 300 to transfer a vibration to the user through the first holding portion 220.

The battery according to an embodiment of the disclosure may supply power to the mobile terminal 300 through the first communication interface 226. In addition, the battery may supply power for an operation of the first ventilation fan 222.

The second holding portion 230 according to an embodiment of the disclosure may have an internal space therein and include at least one of a second ventilation fan 232, an eccentric motor or a battery.

The second ventilation fan 232 according to an embodiment of the disclosure may blow air to an internal space of the main body 210 through the second vents 217. The air flow along the radiation fins 253 can be discharged through the rear opening 213.

The eccentric motor according to an embodiment of the disclosure may operate according to a manipulation of the mobile terminal 300 to transfer a vibration to the user through the second holding portion 230.

The battery according to an embodiment of the disclosure may be electrically connected to the first communication interface 226 to supply power to the mobile terminal 300. The battery may be connected to the first communication interface 226 by various methods and be connected through, for example, a flexible printed circuit board (FPCB). In addition, the battery may supply power for an operation of the second ventilation fan 232.

Figure 5C:
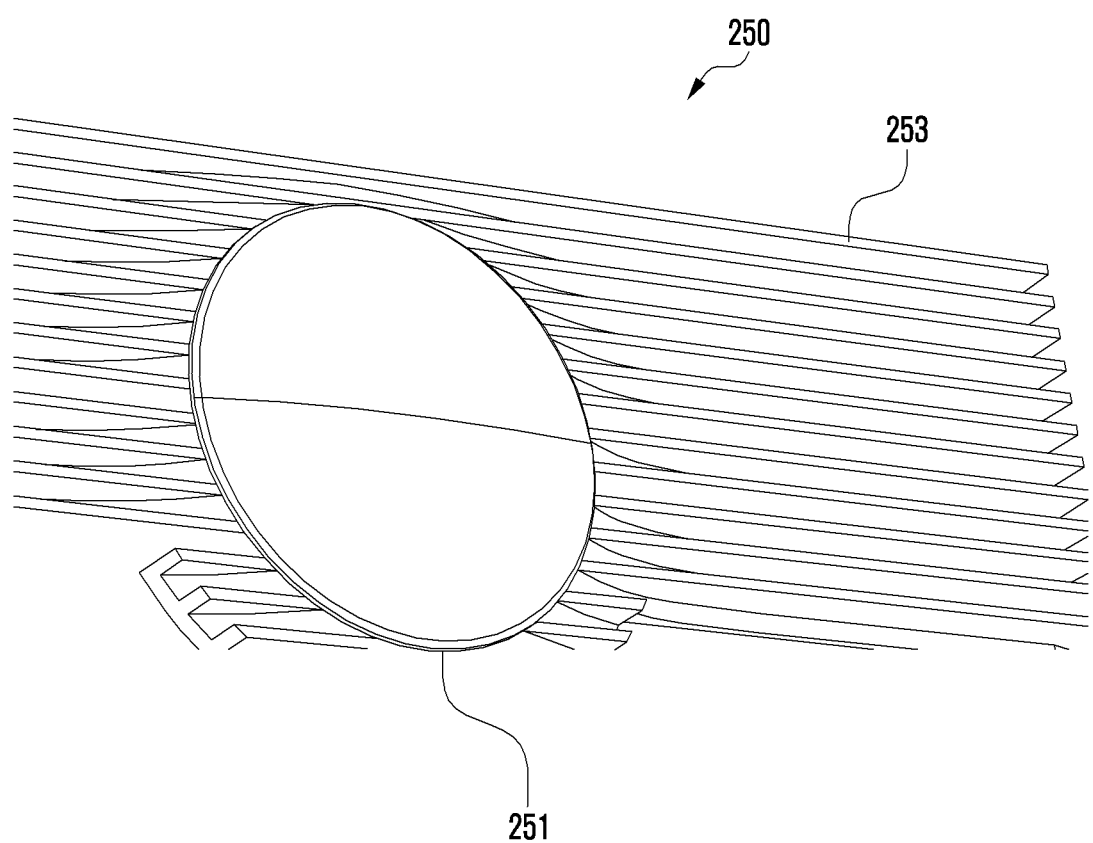

FIGS. 5A to 5C are diagrams illustrating the radiating structure 250 of the auxiliary control electronic device 200 according to an embodiment of the disclosure.

FIG. 5A is a cross-sectional view illustrating the auxiliary control electronic device 200 in which the mobile terminal 300 is seated; FIG. 5B is a diagram illustrating a bottom surface of the first holding portion 220, a bottom surface of the main body 210, and the radiating structure 250; and FIG. 5C is a diagram illustrating the heat sink 251 and the radiation fins 253.

One surface of the heat sink 251 according to an embodiment of the disclosure may contact the mobile terminal 300 through the front opening 211 of the main body 210. The heat conductive sheet 255 may be attached to one surface of the heat sink 251, which may increase heat transfer efficiency between the mobile terminal 300 and the heat sink 251.

The radiating fins 253 may be disposed to the other surface of the heat sink 251 according to an embodiment of the disclosure and be disposed side by side in a direction of the air-flow establish by the first vent 215 and the second vent 217. A central portion of the heat sink 251 may protrude further than an end portion positioned towards the first holding portion 220 and the second holding portion 230 of the heat sink 251. The protruding portion may correspond to a position of the rear opening 213 of the main body 210. The protruding portion may be guided so that the air-flow established by the first vent 215 and the second vent 217 is discharged to the rear opening 213 via the radiation fins 253. A height (or thickness) of the radiating fins 253 gradually lowers as they approach the center of the heat sink 251; thus, a height of an end portion of the radiating fins 253 may be formed to be uniform over the entire heat sink 251.

Figure 6A:
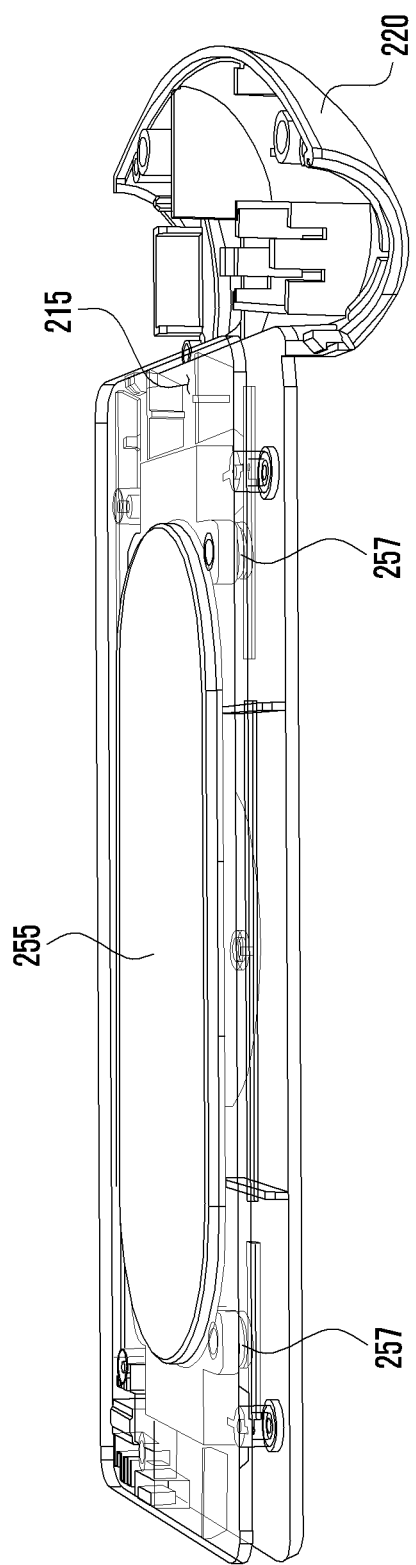
FIG. 6A and FIG. 6B are diagrams illustrating radiating fins and a radiating plate according to an embodiment of the disclosure.
Figure 6B:
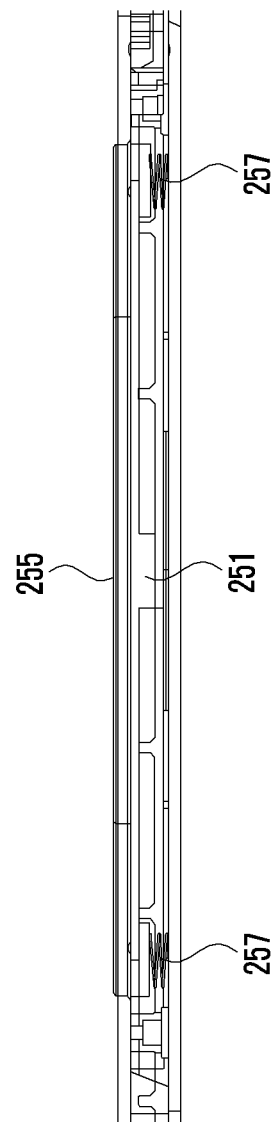

FIG. 6A and FIG. 6B are diagrams illustrating the radiating fins 253 and the heat sink 251 according to an embodiment of the disclosure.

The heat sink 251 and the radiation fins 253 according to an embodiment of the disclosure may protrude in a front direction of the main body 210 at an internal space of the main body 210 or may be inserted towards the bottom of the main body 210. As illustrated in FIG. 6B, an elastic member 257 disposed between a bottom surface of the main body 210 and the heat sink 251 may press the heat sink 251 to the top surface of the main body 210. As the mobile terminal 300 is seated in the seating portion 240 of the main body 210, one surface of the heat sink 251 is pressed; thus, the heat sink 251 may be inserted into an internal space of the main body 210. As the elastic member 257 presses the heat sink 251, close contact of the mobile terminal 300 (seated in the seating portion 240) and the heat sink 251 may be maintained.

Figure 7A:
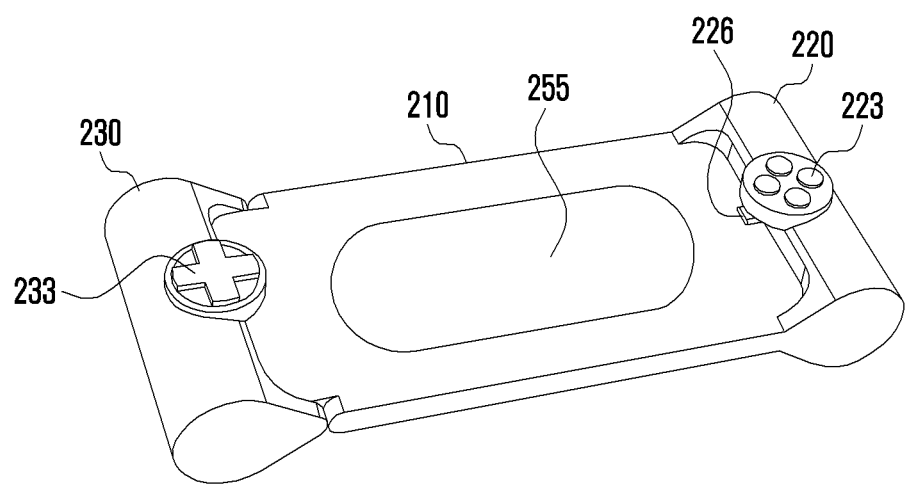
FIG. 7A, FIG. 7B, and FIG. 7C are diagrams illustrating a process of inserting a mobile terminal into an auxiliary control electronic device according to an embodiment of the disclosure.
Figure 7B:
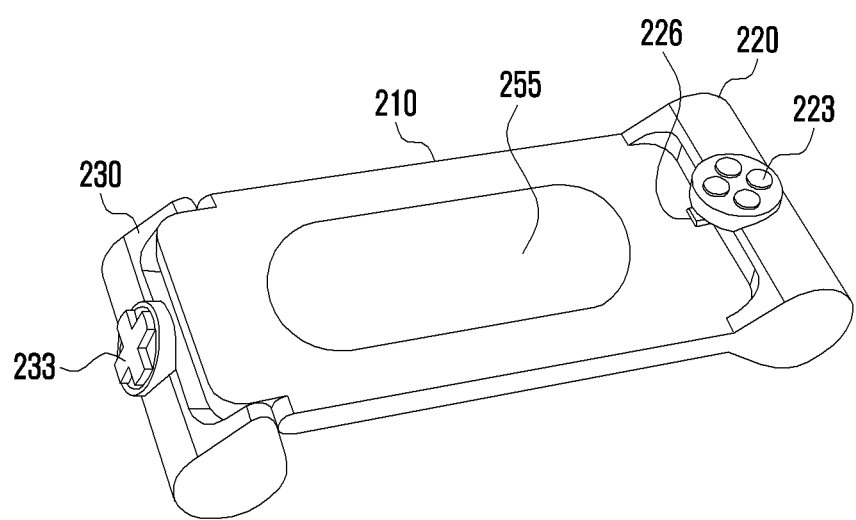
Figure 7C:
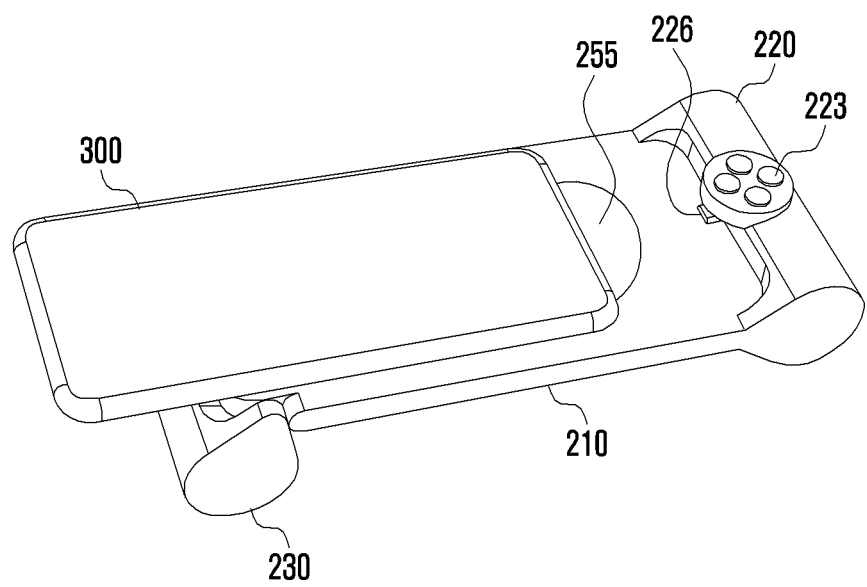

FIGS. 7A to 7C are diagrams illustrating a process of inserting the mobile terminal 300 into the auxiliary control electronic device 200 according to an embodiment of the disclosure.

As illustrated in FIG. 7A, by bending and rotating the second holding portion 230 of a fixed state to a bottom surface of the main body 210, as illustrated in FIG. 7B, the second holding portion 230 is in an opening state, and by sliding the mobile terminal 300 to the seating portion 240, the mobile terminal 300 may be fitted and coupled between the first control panel 223 and the main body 210. By rotating again the second holding portion 230 in a front direction of the main body 210, the second holding portion 230 is in a fixed state; thus, the mobile terminal 300 may be fixed by the second control panel 233.

A process of separating the mobile terminal 300 according to an embodiment of the disclosure may be performed in the reverse order of the above-described process. By bending and rotating the second holding portion 230 in a fixed state to a bottom surface of the main body 210, the second holding portion 230 is in an opening state, by performing a sliding movement of the mobile terminal 300, the mobile terminal 300 is separated, and by rotating the second holding portion 230 to the top surface of the main body 210, the second holding portion 230 is in a fixed state; thus, the mobile terminal 300 may be separated.

Figure 8:
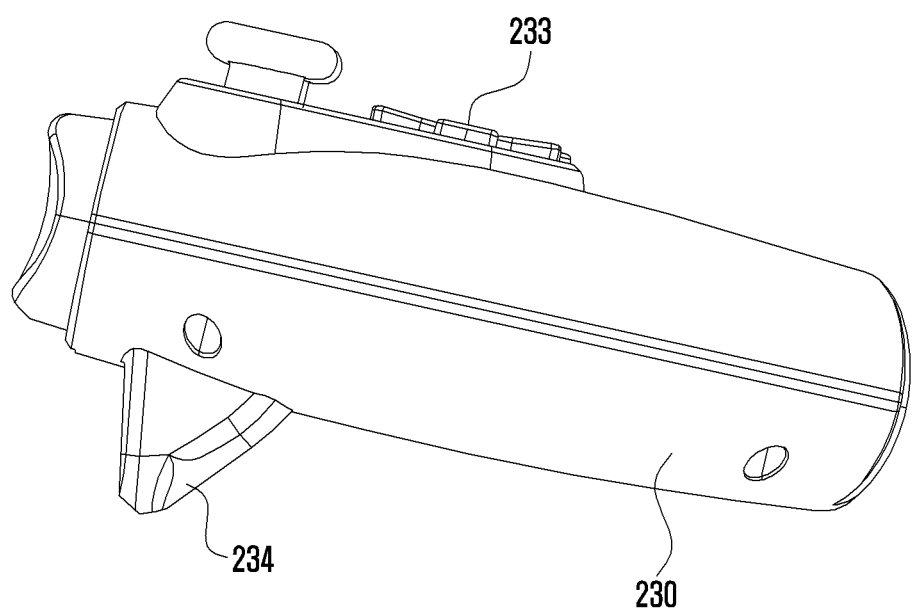
FIG. 8 is a diagram illustrating a support state of an auxiliary control electronic device according to an embodiment of the disclosure.

FIG. 8 is a diagram illustrating a state of supporting the auxiliary control electronic device 200 according to an embodiment of the disclosure.

The third control panel 224 and the fourth control panel 234 according to an embodiment of the disclosure may be formed at a bottom surface of the first holding portion 220 and a bottom surface of the second holding portion 230, respectively. The third control panel 224 may be disposed to protrude from the bottom surface of the first holding portion 220 in a state close to the upper end of the bottom surface of the first holding portion 220, and the fourth control panel 234 may be disposed to protrude from the bottom surface of the second holding portion 230 in a state close to the upper end of the bottom surface of the second holding portion 230.

The third control panel 224 and the fourth control panel 234, according to an embodiment of the disclosure, may be inserted into the first holding portion 220 or the second holding portion 230 only when an external force operates that is larger than the sum of a load of the auxiliary control electronic device 200 and a load of the mobile terminal 300 mounted in the auxiliary control electronic device 200. Therefore, the auxiliary control electronic device 200 may be used as a cradle of the mobile terminal 300 by using the third control panel 224 and the fourth control panel 234, as illustrated in FIG. 8.

The auxiliary control electronic device 200 of the mobile terminal 300 according to an embodiment of the disclosure may include a main body 210 having a seating portion 240 configured to seat the mobile terminal 300 at a top surface and having a radiating structure 250 therein; a first holding portion 220 formed at one side corner of the main body 210; and a second holding portion 230 hinge-coupled to the other side corner facing one side corner of the main body 210 to rotate to a bottom surface of the main body 210.

The main body 210 may have an internal space therein, and a front opening 211 and a rear opening 213 may be formed at the top surface and the bottom surface, respectively, to enable the outside of the main body 210 and the internal space to be connected.

The first holding portion 220 may have an internal space therein and be connected to an internal space through a first vent 215 formed in one side corner of the main body 210, and the second holding portion 230 may have an internal space therein and be connected to the internal space through a second vent 217 formed in the other side corner of the main body 210.

The radiating structure 250 may include a heat sink 251 disposed at an internal space of the main body 210 and having one surface contacting the mobile terminal seated in the seating portion 240 through the front opening 211 and radiating fins 253 disposed at the other surface of the heat sink 251 and formed side by side in a direction of the first holding portion 220 and the second holding portion 230.

The other surface of the heat sink 251 may be formed to protrude towards the center from an end portion of the first holding portion 220 side and an end portion of the second holding portion 230 side.

A first ventilation fan 222 may be disposed at the internal space of the first holding portion 220, and the first ventilation fan 222 may supply air to the internal space of the main body 210 through the first vent 215; and a second ventilation fan 232 may be disposed in the internal space of the second holding portion 230, and the second ventilation fan 232 may supply air to the internal space of the main body 210 through the second vent 217.

A height of the radiating fins 253 may be formed to be lower as they advance to the center from an end portion of the first holding portion 220 side and an end portion of the second holding portion 230 side to enable the radiating fins 253 protruded from the heat sink 251 to have a uniform height.

At one surface of the heat sink 251, a thermal conductive sheet 255 may be disposed to correspond to the front opening 211 of the main body 210.

The auxiliary control electronic device may further include an elastic member 257 disposed between the heat sink 251 and the bottom surface of the main body 210 and configured to press the heat sink 251 to the top surface of the main body 210.

The auxiliary control electronic device may further include a first control panel 223 disposed at a top surface of the first holding portion 220 and disposed at a position of the center of one side corner of the main body 210 and a second control panel 233 disposed at a top surface of the second holding portion 230 and disposed at a position of the center of the other side corner of the main body 210, wherein the first control panel 223 and the second control panel 233 may be partially protruded towards the main body 210 to be overlapped by a predetermined distance in a front direction of the main body 210.

The auxiliary control electronic device may further include a third control panel 224 disposed to protrude from a bottom surface of the first holding portion 220 at the upper end of the bottom surface of the first holding portion 220, configured to elastically rotate using one side corner as a rotation axis, inserted into the first holding portion 220 when an external force operates, and protruded to the bottom surface of the first holding portion 220 when an external force is removed; and a fourth control panel 234 disposed to protrude from the bottom surface of the second holding portion 230 at the upper end of the bottom surface of the second holding portion 230, configured to rotate elastically using one side corner as a rotation axis, inserted into the second holding portion 230 when an external force operates, and protruded to the bottom surface of the second holding portion 230 when an external force is removed.

An eccentric motor may be disposed at the internal space of the first holding portion 220 or the internal space of the second holding portion 230.

The auxiliary control electronic device may further include a battery configured to supply power to the first ventilation fan 222 and the second ventilation fan 232 at an internal space of the first holding portion 220 and an internal space of the second holding portion 230.

The battery may supply power to the mobile terminal seated in the seating portion 240.

The auxiliary control electronic device may further include a first communication interface 226 disposed in the first holding portion 220 to be connected to the mobile terminal.

The auxiliary control electronic device may further include a second communication interface 227 disposed in the first holding portion 220 and electrically connected to the battery and the first communication interface 226.

The auxiliary control electronic device may further include a third communication interface 236 disposed in the second holding portion 230 and electrically connected to the first communication interface 226.

As described above, when manipulating the mobile terminal with the auxiliary control electronic device, the mobile terminal can be manipulated elaborately and conveniently; and, even though the mobile terminal is used for a long time, a performance deterioration problem caused by power shortage and heat generation can be prevented.

Further, the auxiliary control electronic device can perform a function of a cradle that can support the mobile terminal.

DESCRIPTION OF SYMBOLS

200: auxiliary control electronic device
210: main body
210*a*: top surface
210*b*: bottom surface
211: front opening
213: rear opening
215: first vent
217: second vent
220: first holding portion
222: first ventilation fan
223: first control panel
224: third control panel
226: first communication interface
227: second communication interface
230: second holding portion
232: second ventilation fan
233: second control panel
234: fourth control panel
236: third communication interface
240: seating portion
250: radiating structure
251: heat sink
253: radiating fin
255: heat conductive sheet
257: elastic member
300: mobile terminal Although embodiments of the disclosure have been described in detail hereinabove, it should be clearly understood that many variations and modifications of the basic inventive concepts herein described, which may appear to those skilled in the art, are within the spirit and scope of the embodiments of the disclosure as defined in the appended claims.

What is claimed is:

1. An auxiliary electronic controller of a mobile terminal, comprising:
   a main body having a seating portion configured to seat the mobile terminal at a top surface of the main body, and having a radiating structure disposed therein;
   a first holding portion formed at one side of the main body; and
   a second holding portion hinge-coupled to another side facing the one side of the main body to rotate to a bottom surface of the main body,
   wherein the second holding portion includes a first control panel.

2. The auxiliary electronic controller of claim 1, wherein:
   the main body has an internal space therein,
   a front opening and a rear opening are formed by the top surface and the bottom surface of the main body, respectively, and
   a space outside of the main body and the internal space are in fluidic communication via the front opening and/or the rear opening.

3. The auxiliary electronic controller of claim 2, wherein the first holding portion has an internal space therein and the internal space in the first holding portion is connected to the internal space of the main body through a first vent formed at one side of the main body, and
   wherein the second holding portion has an internal space therein and the internal space in the second holding portion is connected to the internal space of the main body through a second vent formed in the other side of the main body.

4. The auxiliary electronic controller of claim 3, wherein a first ventilation fan is disposed at the internal space of the first holding portion, and the first ventilation fan is configured to blow air to the internal space of the main body through the first vent, and
   wherein a second ventilation fan is disposed at the internal space of the second holding portion, and the second ventilation fan is configured to blow air to the internal space of the main body through the second vent.

5. The auxiliary electronic controller of claim 4, further comprising a battery configured to supply power to the first ventilation fan and the second ventilation fan.

6. The auxiliary electronic controller of claim 5, wherein the battery is configured to supply power to a terminal connectable to the mobile terminal when the mobile terminal is seated in the seating portion.

7. The auxiliary electronic controller of claim 5, further comprising a first communication interface disposed in the first holding portion to be connected to the mobile terminal.

8. The auxiliary electronic controller of claim 7, further comprising a second communication interface disposed in the first holding portion and electrically connected to the battery and the first communication interface.

9. The auxiliary electronic controller of claim 8, further comprising a third communication interface disposed in the second holding portion and electrically connected to the first communication interface.

10. The auxiliary electronic controller of claim 9, wherein the first control panel is disposed at a top surface of the second holding portion and disposed at a position of a center of the other side of the main body, wherein the auxiliary electronic controller further comprises:
    a second control panel disposed at a top surface of the first holding portion and disposed at a position of a center of one side of the main body, and
    wherein the first control panel and the second control panel partially protrude towards the main body to overlap by a predetermined distance over the top surface of the main body.

11. The auxiliary electronic controller of claim 10, further comprising:
    a third control panel disposed to protrude from a bottom surface of the first holding portion at an upper end of the bottom surface of the first holding portion, configured to elastically rotate using one side as a rotation axis, and configured to insert into the first holding portion when an external force operates and protrude to the bottom surface of the first holding portion when the external force is removed; and
    a fourth control panel disposed to protrude from a bottom surface of the second holding portion at an upper end of the bottom surface of the second holding portion, configured to rotate elastically using one side as a rotation axis, and configured to insert into the second holding portion when the external force operates and protrudes to the bottom surface of the second holding portion when the external force is removed.

12. The auxiliary electronic controller of claim 2, wherein the radiating structure comprises:
    a heat sink disposed at the internal space of the main body and having one surface contacting the mobile terminal seated in the seating portion through the front opening; and
    radiating fins disposed at another surface of the heat sink and formed adjacently in a direction of the first holding portion and the second holding portion.

13. The auxiliary electronic controller of claim 12, wherein the another surface of the heat sink protrudes towards a center from an end portion of the first holding portion and an end portion of the second holding portion.

14. The auxiliary electronic controller of claim 12, wherein a height of the radiating fins is lower as the radiating fins advance to a center from an end portion of the first holding portion and an end portion of the second holding portion.

15. The auxiliary electronic controller of claim 12, wherein at one surface of the heat sink, a thermal conductive sheet is disposed to correspond to the front opening of the main body.

16. The auxiliary electronic controller of claim 12, further comprising an elastic member disposed between the heat sink and the bottom surface of the main body and configured to press the heat sink to the top surface of the main body.

17. The auxiliary electronic controller of claim 3, wherein an eccentric motor is disposed at the internal space of the first holding portion or the internal space of the second holding portion.

18. An auxiliary electronic controller of a mobile terminal, comprising:
    a main body having a seating portion configured to seat the mobile terminal at a top surface of the main body and having a radiating structure disposed therein;
    a first holding portion formed at one side of the main body and is fixed with respect to the main body; and a second holding portion hinge-coupled to another side facing one side of the main body to rotate to a bottom surface of the main body, wherein the second holding portion rotates to the bottom surface of the main body and then the mobile terminal is seated in the seating portion, wherein the second holding portion includes a control panel.

19. The auxiliary electronic controller of claim 18, wherein the seating portion slidably receives the mobile terminal.

20. The auxiliary electronic controller of claim 18, wherein the mobile terminal is fixed to the seating portion by rotating the second holding portion to the top surface of the main body after seating the mobile terminal in the seating portion.

* * * * *